United States Patent [19]

Inoue

[11] Patent Number: 4,754,404

[45] Date of Patent: Jun. 28, 1988

[54] METHOD OF INCISING THE CONTOUR IN AN IMAGE FILM

[76] Inventor: Yoshio Inoue, 19-17, Kitatanabe 4-chome, Higashisumiyoshi-ku, Osaka, Japan

[21] Appl. No.: 931,065

[22] Filed: Nov. 17, 1986

[30] Foreign Application Priority Data

Nov. 22, 1985 [JP] Japan .................................. 60-263494

[51] Int. Cl.$^4$ ....................... G06F 15/46; G06F 15/66
[52] U.S. Cl. ....................................... 364/475; 83/16;
83/367; 83/565; 318/576; 318/577; 318/578; 364/474
[58] Field of Search ................... 364/475, 474; 83/16, 83/367, 100, 565; 318/576, 577, 578

[56] References Cited

U.S. PATENT DOCUMENTS

| | | | |
|---|---|---|---|
| 3,469,482 | 9/1969 | Lee | 83/367 X |
| 3,610,081 | 10/1971 | Gerber | 364/475 X |
| 3,875,389 | 4/1975 | McFadden et al. | 364/475 X |
| 4,117,751 | 10/1978 | Inoue | 83/565 X |
| 4,131,918 | 12/1978 | Pettit et al. | 83/367 X |
| 4,327,615 | 5/1982 | Gerber et al. | 364/475 X |
| 4,385,360 | 5/1983 | Yamada et al. | 364/475 X |
| 4,449,699 | 5/1984 | Ashizawa et al. | 364/475 X |
| 4,594,499 | 6/1986 | Rapsey et al. | 83/171 X |
| 4,641,244 | 2/1987 | Wilson et al. | 364/475 |

Primary Examiner—Jerry Smith
Assistant Examiner—Steve L. Hoang
Attorney, Agent, or Firm—Wenderoth, Lind & Ponack

[57] ABSTRACT

A method of cutting a contour in an image film according to the present invention includes a rough contour-selecting and recording step in which a rough contour of required portions in the image film are memorized in the form of coordinates X, Y; and error-detecting step for establishing a true contour from a concentration-difference of an image taken by a picture-taking element, which is controllably driven by memory output of the recorded rough contour, by determining the magnitude of a deviation between the true contour and the rough contour and the direction of the deviation; a step of correcting the record of the rough contour by the determined value and memorizing the true contour in another memory medium as a collection of new X, Y coordinates; and a step of cutting the film by a cutter controlled by output from the memory medium.

2 Claims, 3 Drawing Sheets

METHOD OF INCISING THE CONTOUR IN AN IMAGE FILM

BACKGROUND OF THE INVENTION

1. Field of the Invention

The present invention relates to a method of cutting a contour on an image film for cutting a masking film equal in shape to a contour of a required portion on the image film on which a picture was taken by photolithography.

2. Description of the Related Art

In the plate-making process of printed matter in which a part of a picture image is utilized, a method, in which a red-coated film, on which a transparent red coat is applied and from which only the red coat can be separated, is overlapped on an image film which is used as a manuscript and the red coat is manually cut off along the contours of a required portion to make a mask for the needless portion, is known.

However, in a case where the above described mask is manually cut off along the contour, a problem has occurred in that working efficiency and cutting accuracy are remarkably unsatisfactory.

So, the present applicant has proposed a method of mechanically cutting the mask in Japanese Patent No. 1015140 that facilitates efficient cutting of the mask with high accuracy.

According to the above described cutting method, in order to remove a needless portion of a light-permeable manuscript such as a photographic film, a locus of a light pen is used for manually tracing a contour of a required image that is detected in the form of coordinates X, Y and simultaneously, a difference of projected brightness in a direction vertical to the contour of the required image is detected by means of a group of photoelectric elements located on a table moving with the light pen to drive a data-input portion for outputting a position-detecting signal of a true contour, and an ultrasonic fine needle is used for cutting only a coat surface of the film to be processed so that the film to be processed is cut in a shape equal to the contour of the required image.

However, with the above described method, an error between the locus of the light pen manually operated and a true contour is corrected to detect a position of the true contour with a mechanism moving in both longitudinal and lateral directions and a plurality of photoelectric elements which must be mechanically operated so as to always be vertical to the contour so that a disadvantage occurs in that an apparatus for correcting the error between the locus of the light pen and the true contour is complicated.

SUMMARY OF THE INVENTION

Thus, it is an object of the present invention to provide a method of cutting a contour in an image film in which an error between a rough contour and a true contour incidental to a contour selected only manually is corrected by a picture-taking element and an image-processor, the contour being accurately determined by a simple operation, and the operation being speeded up so that the operating efficiency is improved.

It is another object of the present invention to provide a method of cutting a contour in an image film in which a detection of a rough contour, a detection of a deviation between the rough contour and the true contour and a control of XY cutter are recorded in memory medium and a difference of time required in each process can be efficiently obtained by adjusting a number of apparatuses used in each process.

The above and other objects and features of the invention will appear more fully hereinafter from a consideration of the following description taken in connection with the accompanying drawing wherein one preferred embodiment is illustrated by way of example.

DETAILED DESCRIPTION OF THE PREFERRED EMBODIMENT

A method of cutting a contour in an image film according to the present invention includes a rough contour-selecting and recording a rough contour of required portions in the image film are memorized in the form of coordinates X, Y; an error-detecting step for establishing a true contour from a concentration-difference of an image taken by a picture-taking element, which is controllably driven by memory output of the recorded rough contour, by determining a deviation between the true contour and the rough contour and the direction of deviation; a step of correcting the record of the rough contour by the determined value and memorizing the true contour in another memory medium as a collection of new coordinates X, Y; and a step of cutting the film by means of a cutter controlled by output from the memory medium.

Figure 1:
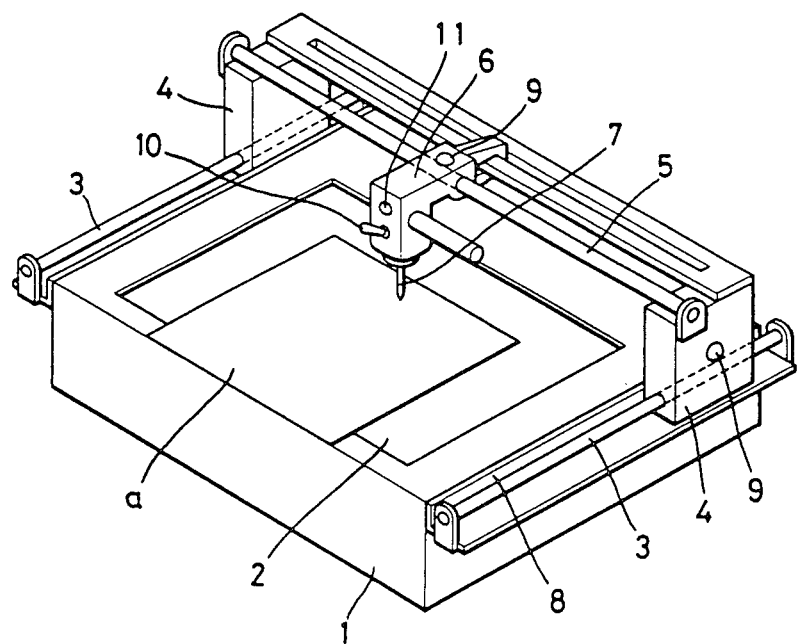
FIG. 1 is a perspective view showing a rough contour-selecting device used for carrying out a method of cutting a contour in an image film according to the present invention by memorizing a rough contour in coordinates X, Y.

Referring now to FIG. 1 showing an example of an apparatus used in a process of selecting and recording a rough contour of a required portion in an image film, an upper surface of a box member 1 with a light source housed therein has a manuscript film-placing glass plate 2, a lateral guide shaft 5 is fixedly mounted on longitudinally travelling members 4, 4 guided along respective longitudinal shafts 3 fixedly mounted on both sides of the box member 1, an arm 6 guided by the guide shaft 5 to move in a lateral direction is provided with a pen 7 fixedly mounted on a pointed end thereof and projecting toward the glass plate 2, the pen 7 being movable in a desired direction.

The longitudinal and lateral guide shafts 3, 5 are provided with a magnet scale 8 fixedly mounted and extending parallel thereto the longitudinally travelling member 4 and the arm 6 are provided with a position-reading device 9, respectively, and a contour of an image can be manually traced by pen 7 while looking at a manuscript film a of the image fixedly placed on the glass plate 2 above the light source within the box member 1.

This operation can be done only manually. Thus, it is impossible to accurately trace the contour of the image.

The rough contour obtained by tracing has an error to an extent of 2 mm.

The movement of this pen 7 along the magnet scale 8 is detected by the position-reading device 9 as a collection of coordinates X, Y which are memorized by a memory medium such as a floppy and a tape.

Figure 4A:
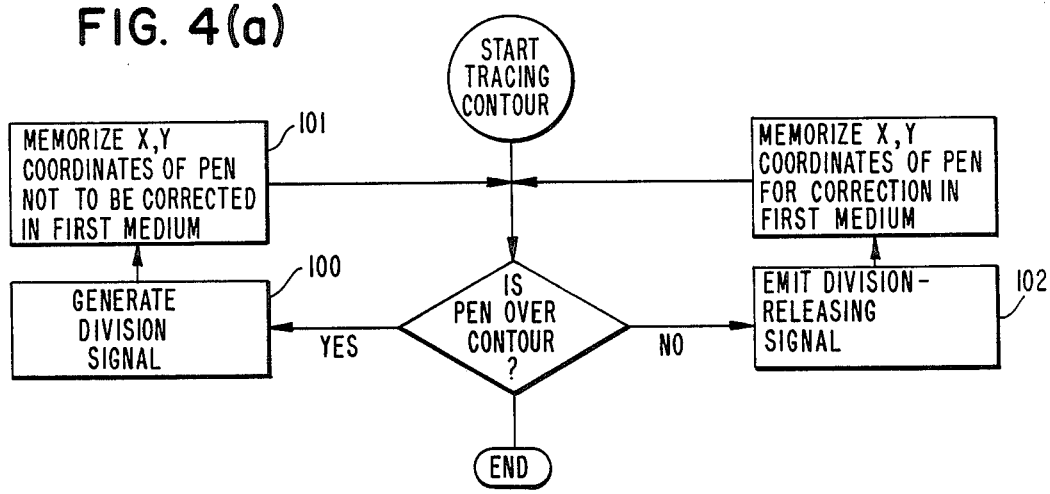
FIGS. 4(a), 4(b) are flowcharts illustrating the method steps according to the present invention with FIG. 4(a) illustrating the steps performed by the apparatus of FIG. 1 and FIG. 4(b) illustrating the steps performed by the apparatus of FIG. 2.

In this case (FIG. 4(a)), if manual tracing occurs at positions over the contour at which no difference in brightness, i.e. a position at which the pen does not deviate from the contour, a division signal 100 is generated by a switch 10 located on the arm 6 or at other suitable locations and the position is memorized in the memory medium 101 and then, when the pen 7 is moved, thus presumption is maintained. When the pen tracing the contour comes to a position where it deviates from the contour, a division-releasing signal 102 is emitted. The positions of the pen between the issuance of the division signal and the division-releasing signal is deemed as a correct positions corresponding to the contour and is not subjected to a correction which will be mentioned later. During the time between the issuance of the division signal and the division-releasing, a signal is displayed by a display lamp 11.

In addition, in the above described apparatus, it is insufficient for the accurate detection of the movement of the pen 7 as a collection of coordinates X, Y that the longitudinal travelling member 4 or the arm 6 be supported by only one guide shaft. A plurality of guide shafts or the addition of other suitable stabilizing mechanisms is required but these are omitted in the drawing.

Figure 2:
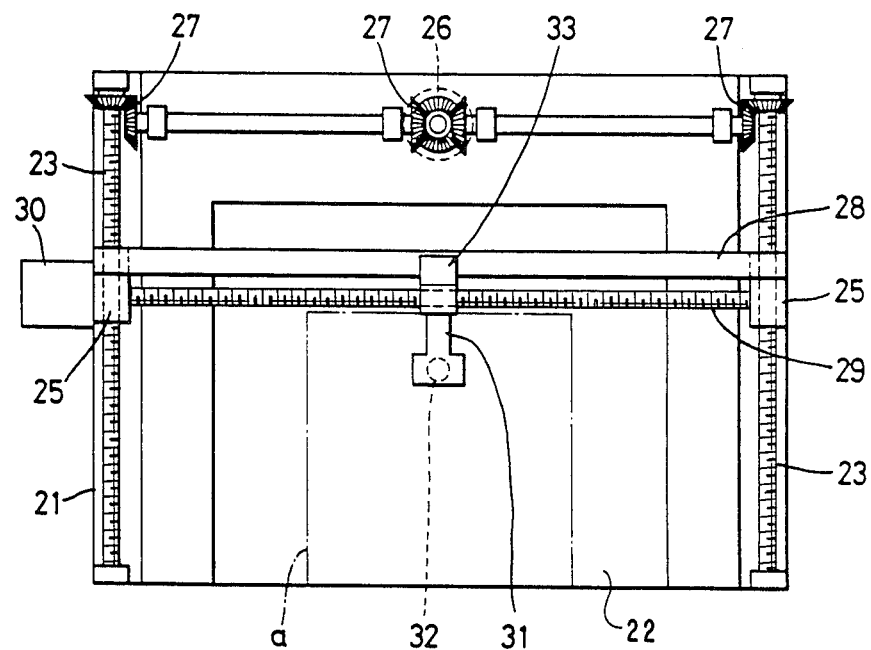
FIG. 2 is a plan view showing a device for detecting an error between a rough contour and a true contour.
Figure 3:
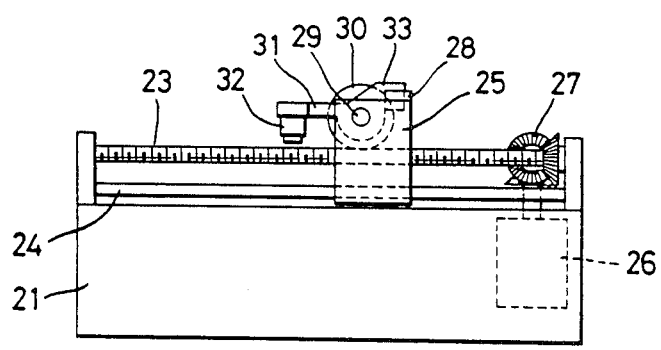
FIG. 3 is a side view of FIG. 2.

Referring now to FIGS. 2, 3 showing an outline of a device used for detecting deviation values for the rough contour, an upper surface of a box member 21 with a light source housed therein is used as a manuscript film having a glass plate 22 fixedly mounted thereto, a travelling member 25 is threaded on a longitudinal feed screw shaft 23 and is guided by guide shafts 24 rotatably mounted on both sides of the box member 21 and extending parallel to said guide shaft, the screw shaft 23 being driven by a longitudinal feed pulse motor 26 through a suitable transmission mechanism 27 so that both longitudinal feed screw shafts 23, 23 may be rotated in the same direction.

Both travelling members 25, 25 are connected to each other through a connecting rod 28 and, a lateral feed screw shaft 29 is rotatably located between the travelling members 25, 25, the lateral feed screw shaft 29 being driven by a lateral feed pulse motor 30. An arm 31 threaded on the screw shaft 29 is provided at an end thereof with a downward picture-taking element 32. Also the arm 31 requires guidance for accurate movement. A construction, in which the connecting rod 28 is slidably engaged between the arm 31 and a holding claw 33 formed integrally with the arm 31, is shown.

Figure 4B:
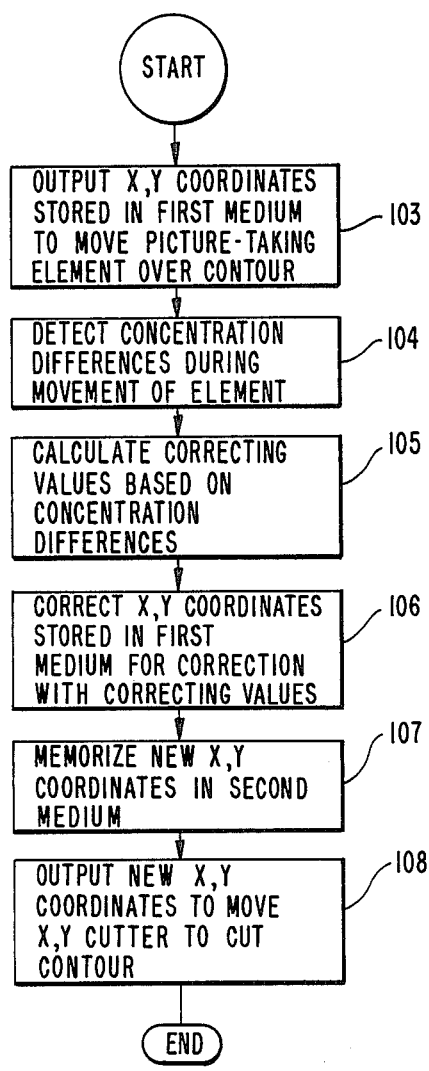

Referring to FIG. 4(b), with the above described apparatus, the manuscript film a is fixedly mounted on the glass plate 22 in nearly the same manner as during the memorization of the rough contour, a center of the picture-taking element 32 is positioned coincident with a starting point in the step of memorizing the rouch contour by driving the pulse motors 26, 30. Subsequently, the pulse motors 26, 30 are controlled by a memory medium in which the rouch contour is memorized, an image of a lower manuscript film is taken by the picture-taking element 32 while moving the picture-taking element 32 along a path corresponding to the rough contour 103. A contour line, whose concentration is rapidly changed, is judged 104 by an image processor so that a distance between this contour and the center of the picture-taking element, that is to say the deviation between the actual contour and the rough contour, and the direction of deviation are detected. A correcting value is calculated 105 from the detected value, and the true contour is obtained by adjusting the X, Y values 106 of the rough contour with corrections corresponding to the correcting values memorized in another memory medium 107.

In the above described operation a difference between the rough contour and the true contour is kept within a range of ±3 mm, so that it is sufficient to carry out the image-processing by the picture-taking element within a range of 6 mm. Provided that an accuracy of manually tracing the contour is 0.2 mm, the following equation results:

$$6 \text{ mm} \div 0.2 \text{ mm} = 30$$

That is to say, it is necessary only to carry out the image-processing for an image obtained by the picture-taking element of 30 rows × 30 lines.

In order to detect the true contour on which the concentration is rapidly changed, the deviation is judged from a row and line of the picture-taking element, at which the concentration difference is rapidly changed from + to − or from − to +, by the levelled two-story differential method and the like, the direction of the deviation of the contour being judged from the change of coordinates X, Y due to the location of the picture-taking element, i.e. from the center of the picture-taking element that is to say, a magnitude and a direction of the deviation between the recorded rough contour and the true contour is detected from numbers of a row and a line of the picture-taking element in a direction vertical to the direction of the contour, a correcting value for X, Y values of the rough contour being calculated from the above described detected values, and the X, Y values of the true contour obtained by correcting the X, Y values of the rough contour being memorized in the memory medium.

If an XY cutter on the market, which is controllably driven in accordance with X, Y coordinates, is operated by the use of a memory medium with the true contour obtained 108 in the above described manner and recorded as X, Y coordinates, a red coat film can be cut by means of the XY cutter so that a mask having a cutting edge coinciding with the true contour can be obtained.

Thus, the recording step of the rough contour, the error-detecting step and the film-cutting step performed by the XY cutter can be combined and the simplification of an apparatus and the improvement of operating efficiency can be achieved by utilizing the image processing method and memory media.

What is claimed is:

1. A method of cutting a contour on an image film comprising:
    tracing a desired portion of the contour on the image film;
    establishing the traced desired portion of the contour as X, Y coordinates and storing the coordinates in a memory medium;
    moving a picture-taking element over the image film and along said coordinates under the output of the memory medium to detect concentration differences between the desired position of the contour and the traced desired portion of the contour;

determining the magnitude and direction of deviations between the desired portion of the contour and the traced desired portion of the contour based on the concentration differences detected by the picture-taking element;

calculating correcting values based on the determined deviations;

adjusting the X, Y coordinates with the calculated correcting values to obtain new X, Y coordinates defining the desired portion of the contour and storing the new coordinates in another memory medium; and outputting the new coordinates from said another medium to move an X, Y cutter over the new coordinates to cut the desired contour.

2. A method as claimed in claim 1, wherein the tracing of the desired portion of the contour comprises manually moving a pen over the desired portion of the contour, and the establishing of the traced desired portion of the contour as X, Y coordinates comprises establishing the traced desired portion of the contour as X, Y coordinates by recording the movement of the pen with a position-reading device moving relative to a magnet scale as the pen traces the desired portion.

* * * * *